United States Patent
Osawa et al.

(10) Patent No.: US 10,061,170 B2
(45) Date of Patent: Aug. 28, 2018

(54) METHOD OF MANUFACTURING ELECTRONIC DEVICE

(71) Applicant: Japan Display Inc., Tokyo (JP)

(72) Inventors: Shuichi Osawa, Tokyo (JP);
Yoshikatsu Imazeki, Tokyo (JP);
Yoichi Kamijo, Tokyo (JP); Yoshihiro Watanabe, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/662,858

(22) Filed: Jul. 28, 2017

(65) Prior Publication Data

US 2018/0031933 A1   Feb. 1, 2018

(30) Foreign Application Priority Data

Jul. 29, 2016   (JP) .................................. 2016-149574

(51) Int. Cl.
| | |
|---|---|
| *H01L 21/48* | (2006.01) |
| *G02F 1/1362* | (2006.01) |
| *H01L 21/285* | (2006.01) |
| *G02F 1/1337* | (2006.01) |
| *B32B 7/04* | (2006.01) |
| *H01L 21/02* | (2006.01) |
| *B23K 26/00* | (2014.01) |

(52) U.S. Cl.
CPC .... *G02F 1/136227* (2013.01); *B23K 26/0063* (2013.01); *B32B 7/04* (2013.01); *G02F 1/133711* (2013.01); *G02F 1/136213* (2013.01); *H01L 21/02063* (2013.01); *H01L 21/28506* (2013.01)

(58) Field of Classification Search
CPC ......... H01L 23/49827; H01L 23/49822; H01L 21/486
See application file for complete search history.

(56) References Cited

U.S. PATENT DOCUMENTS

2013/0056247 A1\* 3/2013 Yoshioka ............ H01L 21/4832
174/251

FOREIGN PATENT DOCUMENTS

JP   2002-40465 A   2/2002

\* cited by examiner

*Primary Examiner* — Thomas L Dickey
(74) *Attorney, Agent, or Firm* — K&L Gates LLP

(57) ABSTRACT

According to one embodiment, a method of manufacturing an electronic device, includes preparing a first substrate including a first basement and a first conductive layer, and a second substrate includes a second basement and a second conductive layer, opposing the first conductive layer and spaced from the first conductive layer, providing a protection layer on the second substrate, forming a first hole penetrating the second substrate by irradiating the second substrate with a laser beam in a position overlapping the protection layer, removing the protection layer and forming a connecting material electrically connecting the first conductive layer and the second conductive layer to each other via the first hole after removing the protection layer.

15 Claims, 12 Drawing Sheets

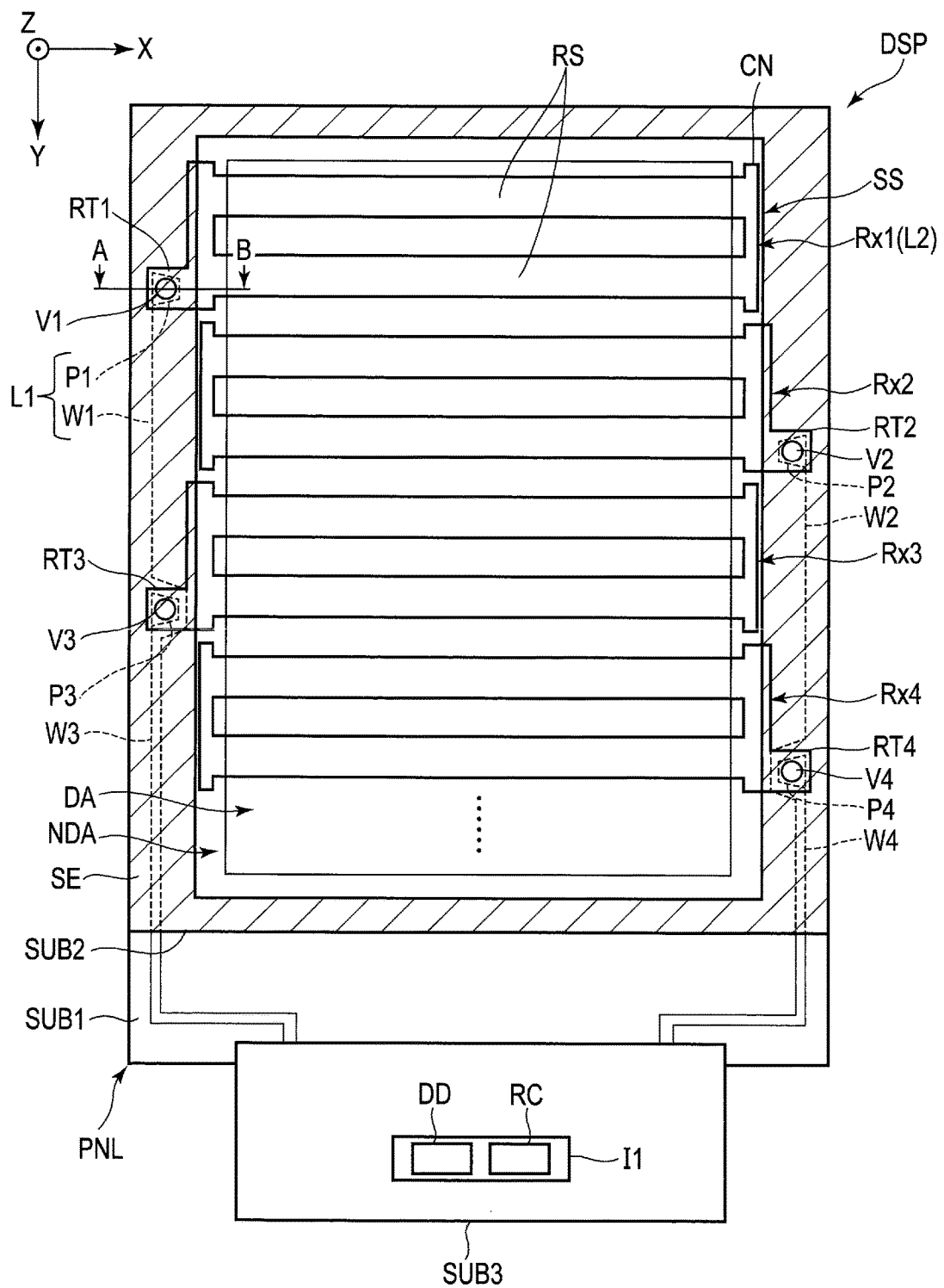
F I G. 1

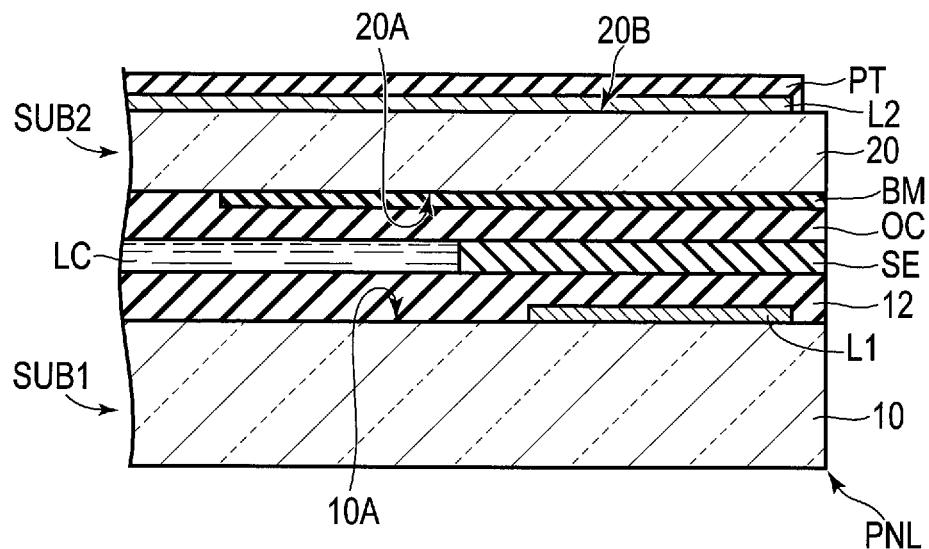
F I G. 7
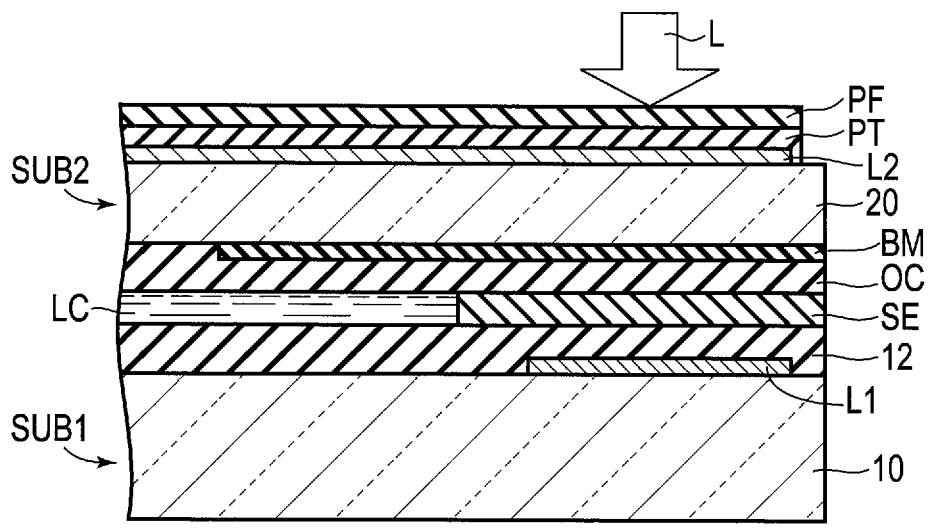
F I G. 8

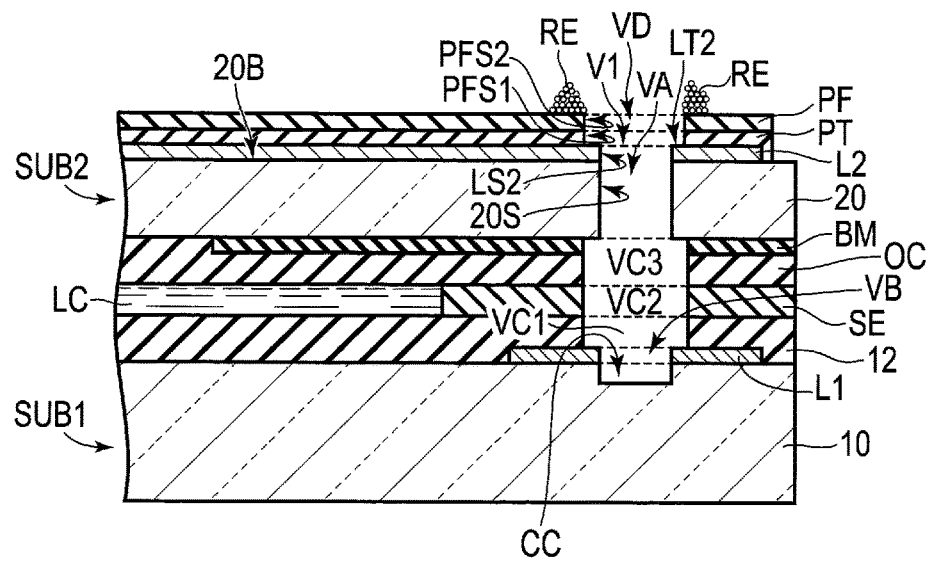
F I G. 9A
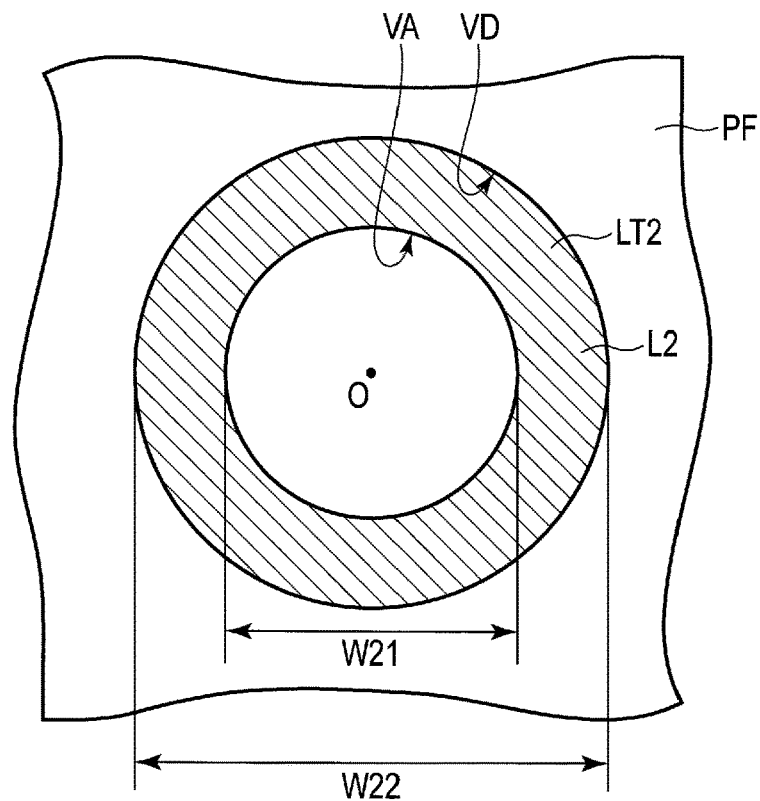
F I G. 9B

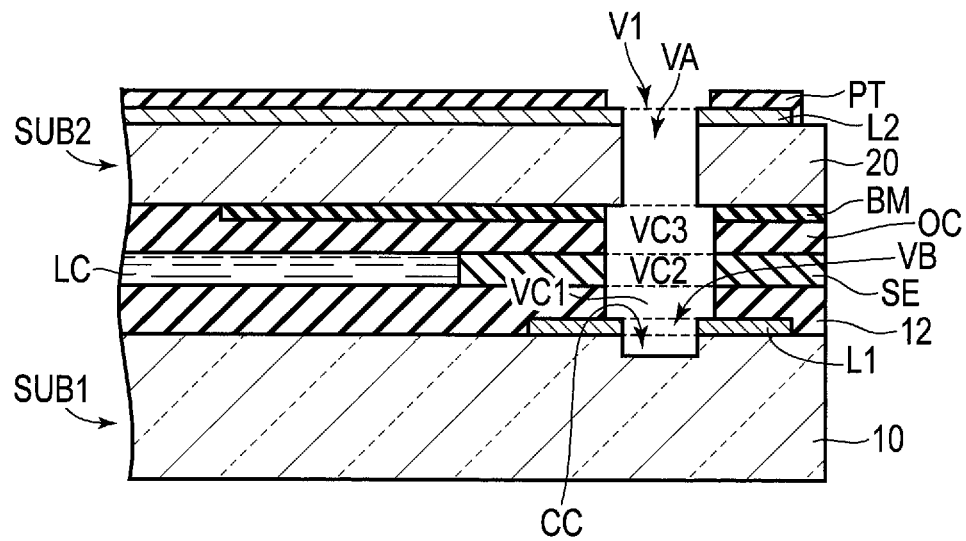
F I G. 10
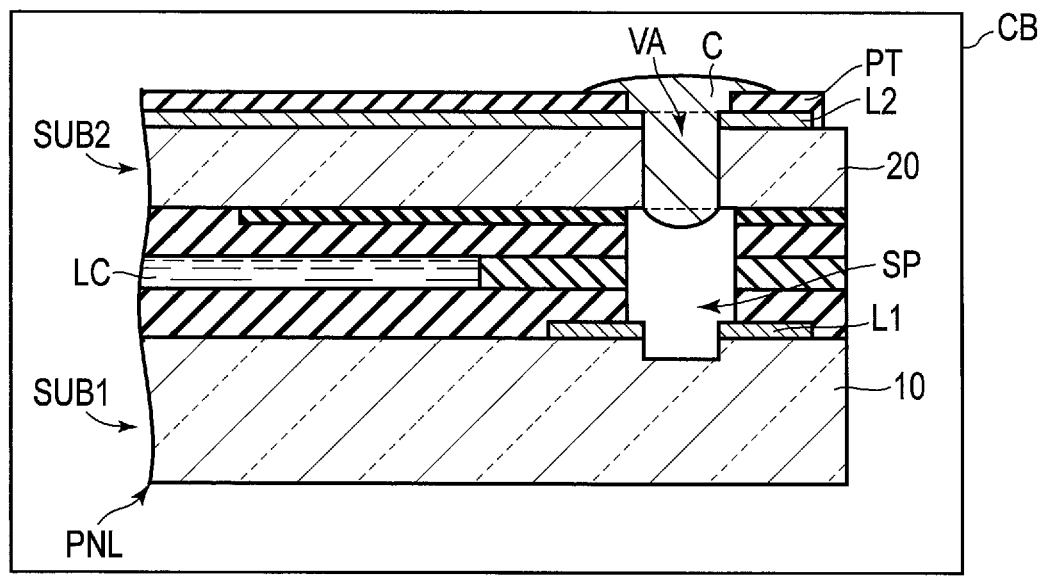
F I G. 11

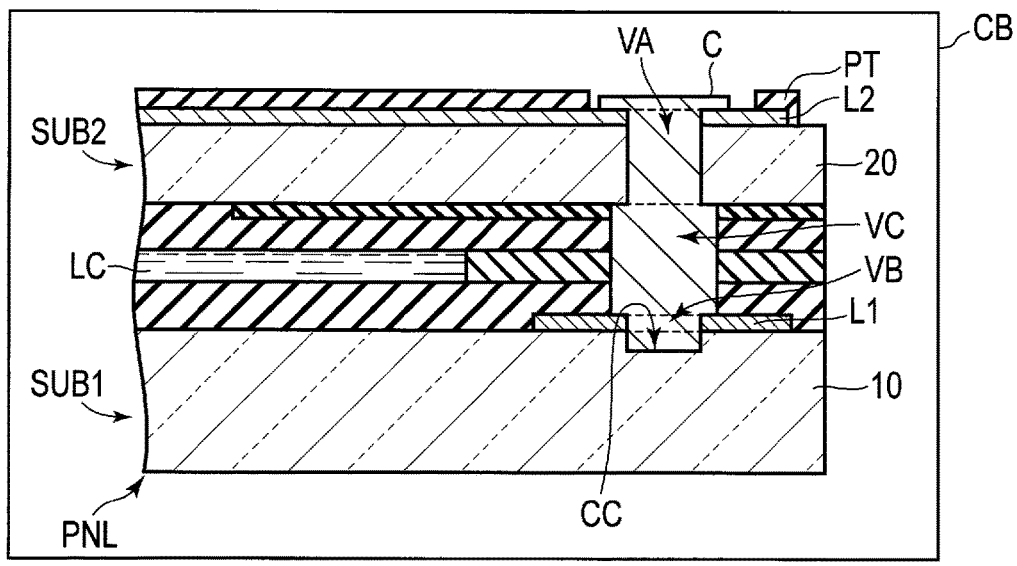
F I G. 12
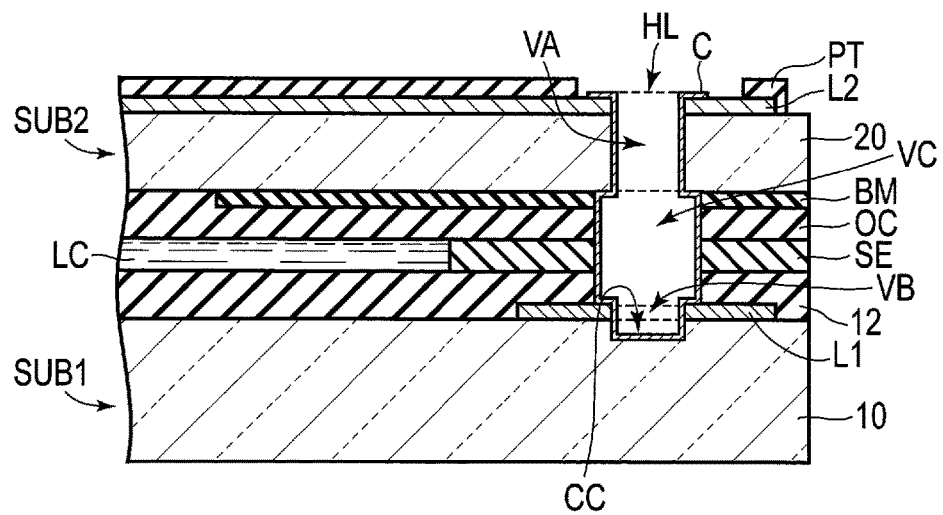
F I G. 13

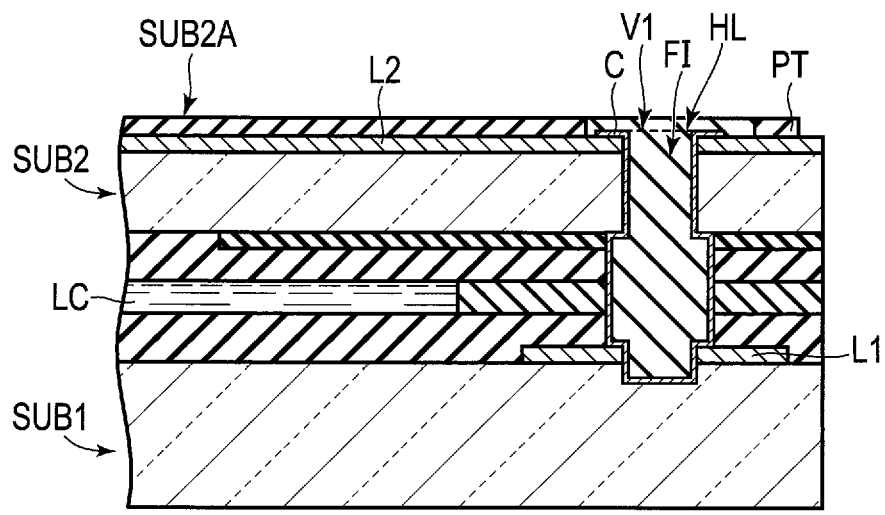
F I G. 14
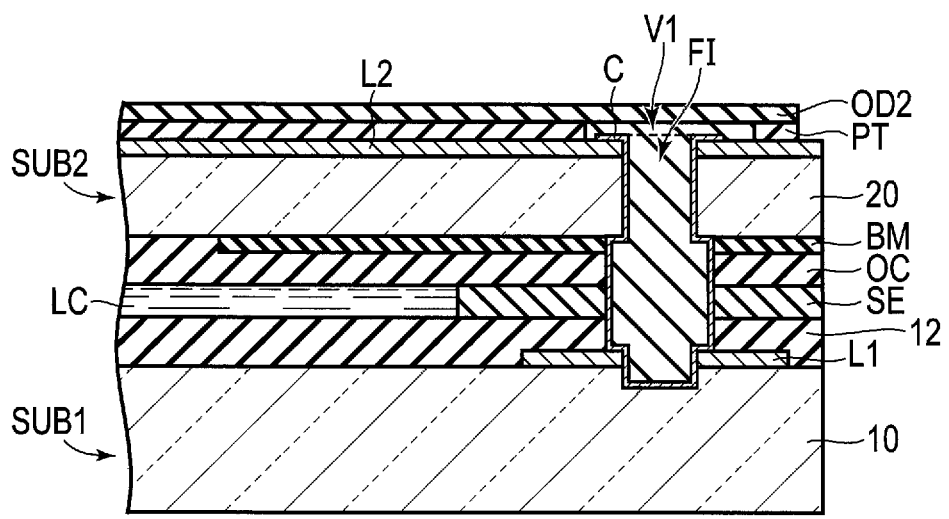
F I G. 15

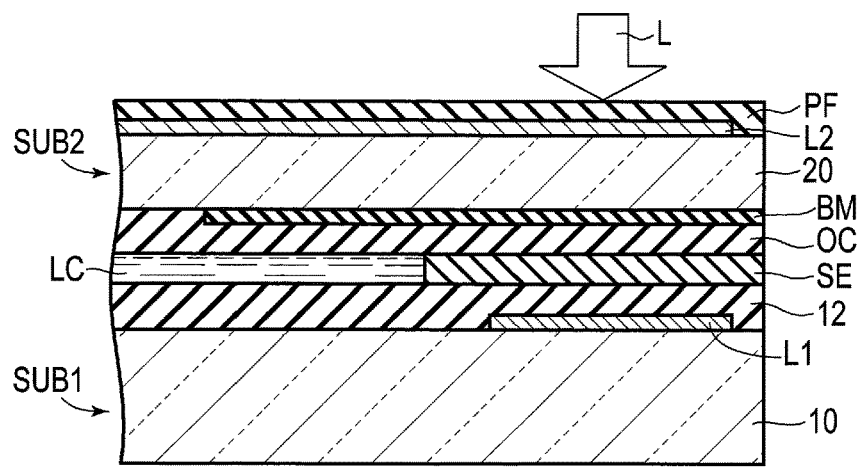
F I G. 16
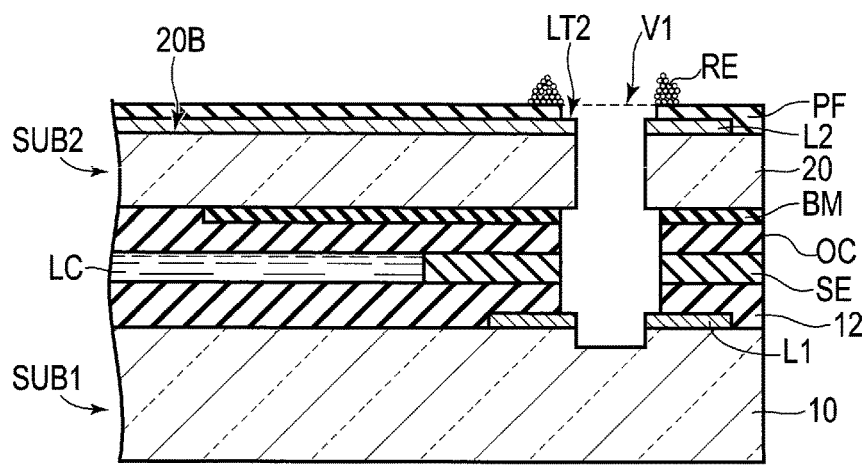
F I G. 17
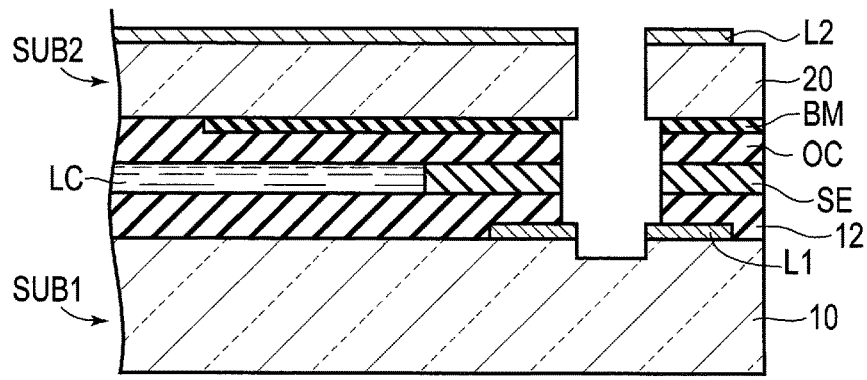
F I G. 18

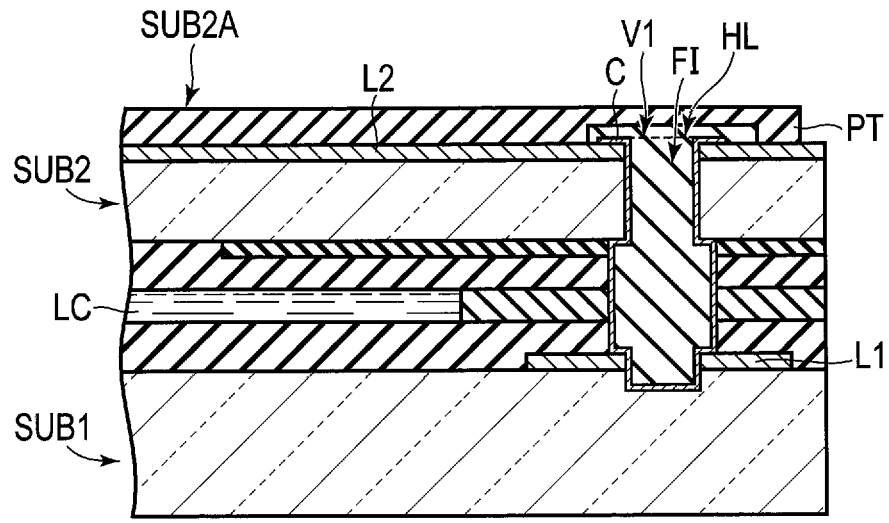
F I G. 19
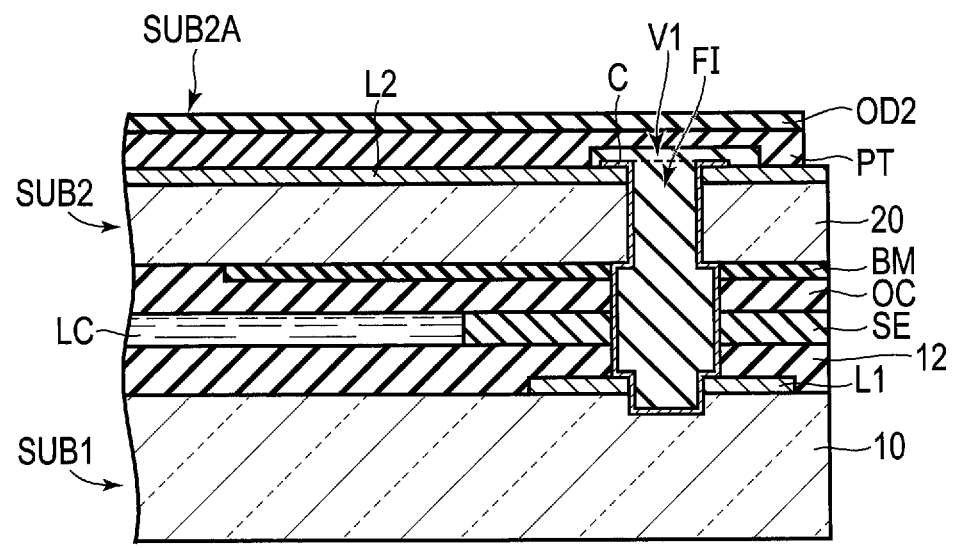
F I G. 20

METHOD OF MANUFACTURING ELECTRONIC DEVICE

CROSS-REFERENCE TO RELATED APPLICATIONS

This application is based upon and claims the benefit of priority from Japanese Patent Application No. 2016-149574, filed Jul. 29, 2016, the entire contents of which are incorporated herein by reference.

FIELD

Embodiments described herein relate generally to a method of manufacturing an electronic device.

BACKGROUND

In recent years, various techniques for reducing the width of the frame in display devices are being studied. One example discloses a technique of utilizing an inter-substrate connecting material which electrically connects a wiring portion comprising a contact-hole connecting material inside a hole which penetrates an inner surface and an outer surface of a resin-made first substrate, and a wiring portion provided on an inner surface of a resin-made second substrate to each other.

SUMMARY

The present disclosure generally relates to a method of manufacturing an electronic device. According to one embodiment, a method of manufacturing an electronic device includes preparing a first substrate comprising a first basement and a first conductive layer, and a second substrate comprising a second basement and a second conductive layer, opposing the first conductive layer and spaced from the first conductive layer; providing a protection layer on the second substrate; forming a first hole penetrating the second substrate by irradiating the second substrate with a laser beam in a position overlapping the protection layer; removing the protection layer; and forming a connecting material electrically connecting the first conductive layer and the second conductive layer to each other via the first hole after removing the protection layer. Additional features and advantages are described herein, and will be apparent from the following Detailed Description and the figures.

BRIEF DESCRIPTION OF THE DRAWINGS

FIG. 1 is a plan view showing a configuration example of a display device of an embodiment.

FIG. 7 is a cross section for illustrating a step of preparing a display panel.

FIG. 8 is a cross section for illustrating a step of providing a protection layer and irradiating a laser beam.

FIG. 9A is a cross section showing the display panel after irradiating a laser beam.

FIG. 9B is a plan view showing a configuration of a hole shown in FIG. 9A.

FIG. 10 is a cross section for illustrating a step of removing a protection layer.

FIG. 11 is a cross section for illustrating a step of injecting a connecting material into a hole.

FIG. 12 is a cross section for illustrating a step of filling a hole to a hole and a concavity with a connecting material.

FIG. 13 is a cross section for illustrating a step of evaporating a solvent contained in the connecting material.

FIG. 14 is a cross section for illustrating a step of forming a filling material.

FIG. 15 is a cross section for illustrating a step of adhering a second optical element.

FIG. 16 is a cross section for illustrating a step of providing a protection layer and irradiating a laser beam.

FIG. 17 is a cross section showing the display panel after irradiating a laser beam.

FIG. 18 is a cross section for illustrating a step of removing a protection layer.

FIG. 19 is a cross section for illustrating a step of forming a filling material and a protection member.

FIG. 20 is a cross section for illustrating a step of adhering a second optical element.

DETAILED DESCRIPTION

Figure 2:
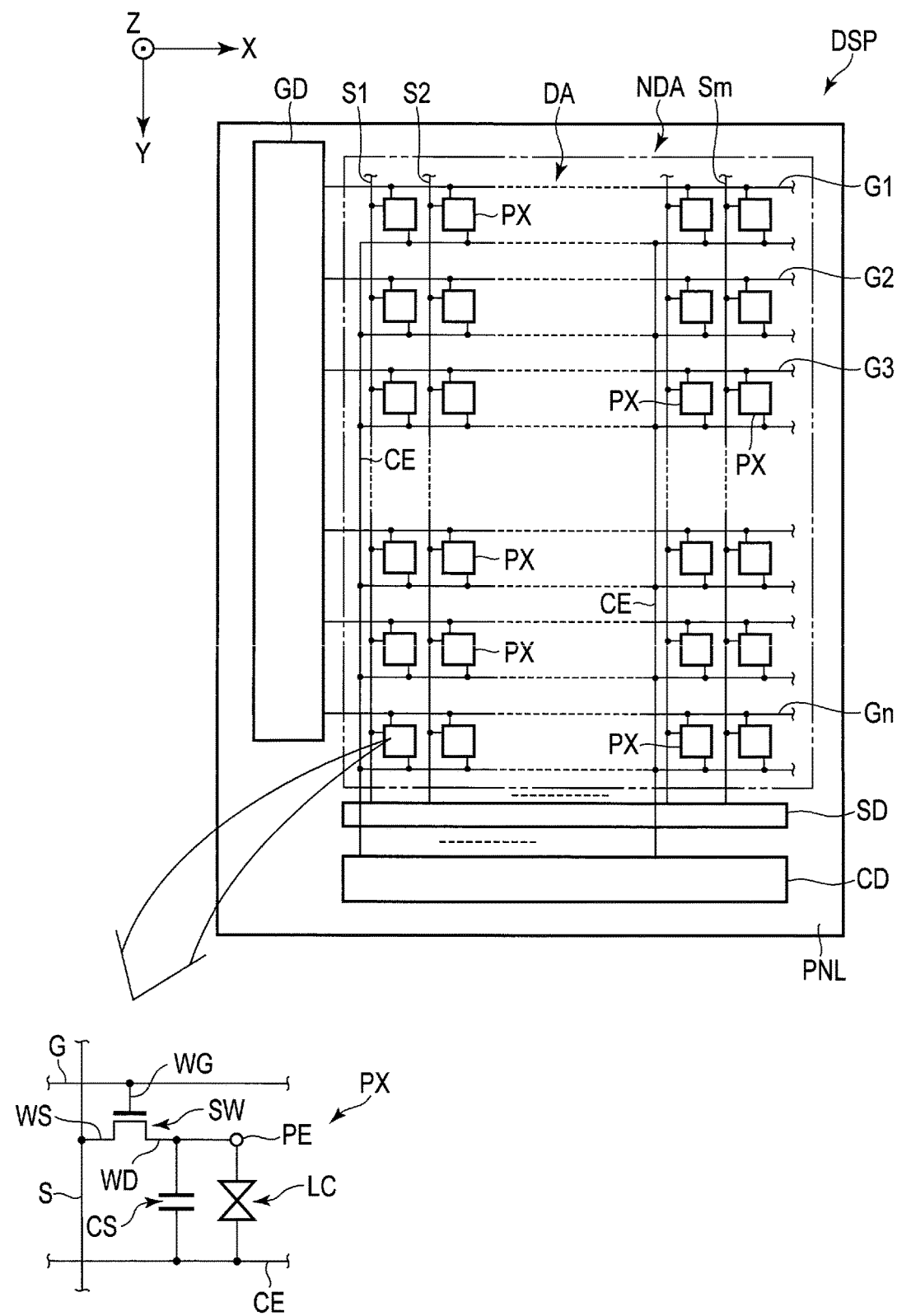
FIG. 2 is a diagram showing a basic structure and an equivalent circuit of a display panel shown in FIG. 1.

In general, according to one embodiment, a method of manufacturing an electronic device, comprises preparing a first substrate comprising a first basement and a first conductive layer, and a second substrate comprising a second basement and a second conductive layer, opposing the first conductive layer and spaced from the first conductive layer, providing a protection layer on the second substrate, forming a first hole penetrating the second substrate by irradiating the second substrate with a laser beam in a position overlapping the protection layer, removing the protection layer and forming a connecting material electrically connecting the first conductive layer and the second conductive layer to each other via the first hole after removing the protection layer.

Embodiments will now be described with reference to accompanying drawings. Note that the disclosure is presented for the sake of exemplification, and any modification and variation conceived within the scope and spirit of the invention by a person having ordinary skill in the art are naturally encompassed in the scope of invention of the present application. Furthermore, a width, thickness, shape, and the like of each element are depicted schematically in the figures as compared to actual embodiments for the sake of simpler explanation, and they do not limit the interpretation of the invention of the present application. Furthermore, in the description and figures of the present application, structural elements having the same or similar functions will be referred to by the same reference numbers and detailed explanations of them that are considered redundant may be omitted.

In the embodiment, a liquid crystal display device will be disclosed as an example of the display device. The liquid crystal display device can be used in, for example, various types of equipment such as smartphones, tablet terminals, mobile telephone terminals, notebook personal computers, and game consoles. The major configuration explained in the present embodiment can also be applied to a liquid crystal device, a self-luminous display device comprising an organic electroluminescent display element, and the like, an electronic paper display device comprising an electrophoretic element, and the like, a display device employing micro-electromechanical systems (MEMS), or a display device employing electrochromism.

FIG. 1 is a plan view showing a configuration example of a display device DSP of this embodiment. Here, a liquid crystal display in which a sensor SS is installed will be described as an example of the display device DSP.

A first direction X, a second direction Y, and a third direction Z are orthogonal to each other, but they may cross at an angle other than 90 degrees. The first direction X and the second direction Y are parallel to a surface of a substrate of the display device DSP, and the third direction Z is a thickness direction of the display device DSP. Here, FIG. 1 shows a plan view of the display device DSP in an X-Y plane defined by the first direction X, and the second direction Y. In the following descriptions, a view of the X-Y plane from the third direction Z defined as a plan view.

The display device DSP comprises a display panel PNL, an IC chip I1, an IC chip I2, a wiring substrate SUB3. The display panel PNL is a liquid crystal display panel, and comprises a first substrate SUB1, a second substrate SUB2, a sealant SE and a display function layer (liquid crystal layer LC, which will be described later). The second substrate SUB2 opposes the first substrate SUB1. The sealant SE corresponds to a portion hatched by lines upwardly slanting to the right in FIG. 1 and attaches the first substrate SUB1 and the second substrate SUB2 together.

The display panel PNL comprises display area DA which displays images and a frame-shaped non-display area NDA surrounding the display area DA. The sealant SE is located in the non-display area NDA and the display area DA is located in an inner side encircled by the sealant SE.

The wiring substrate SUB3 is mounted on the first substrate SUB1. The wiring substrate SUB3 having such configuration is, for example, a flexible substrate with flexibility. Note that a flexible substrate applicable to this embodiment should only comprise at least partially a flexible portion of a bendable material. For example, the wiring substrate SUB3 of this embodiment each may be a flexible substrate in its entirety, or may be a rigid flexible substrate comprising a rigid portion formed of a rigid material such as glass epoxy and a flexible portion formed of a bendable material such as polyimide.

The IC chip I1 is mounted on the wiring substrate SUB3. Note that this configuration is not limited to the example illustrated, but the IC chip I1 may be mounted on the portion of the first substrate SUB1, which extends out from the second substrate SUB2, or on an external circuit board connected to the wiring substrate SUB3. The IC chip I1 includes, for example, a built-in display driver DD which outputs a signal required to display images. The display driver DD described here contains at least a part of signal line drive circuits SD, scanning line drive circuits GD and common electrode drive circuits CD, which will be described later. In the example illustrated, the IC chip I1 contains a built-in detector RC which functions as a touch-panel controller or the like. The detector RC may be built in the IC chip I1 or an IC chip other than the IC chip I1.

The display panel PNL may be, for example, any one of a transmissive type which displays images by selectively transmitting light from below the first substrate SUB1, a reflective type which displays images by selectively reflecting light from above the second substrate SUB2 and a trans-reflective type comprising a transmissive display function and a reflective display function.

A sensor SS carries out sensing to detect contact or approaching of an object with respect to the display device DSP. The sensor SS comprises a plurality of detection electrodes Rx (Rx1, Rx2, Rx3, Rx4, . . . ). The detection electrodes Rx are each formed on the second substrate SUB2. Let us assume in this embodiment that the detection electrodes Rx are a second conducting layer L2 disposed on the second substrate SUB2. These detection electrodes Rx each extend in the first direction X and are arranged along the second direction Y with gaps therebetween.

FIG. 1 illustrates detection electrodes Rx1 to Rx4 as the detection electrodes Rx, and here a configuration example thereof will be described focusing on the detection electrode Rx1. That is, the detection electrode Rx1 comprises detectors RS1, a terminal RT1 and a connector CN1.

Figure 5:
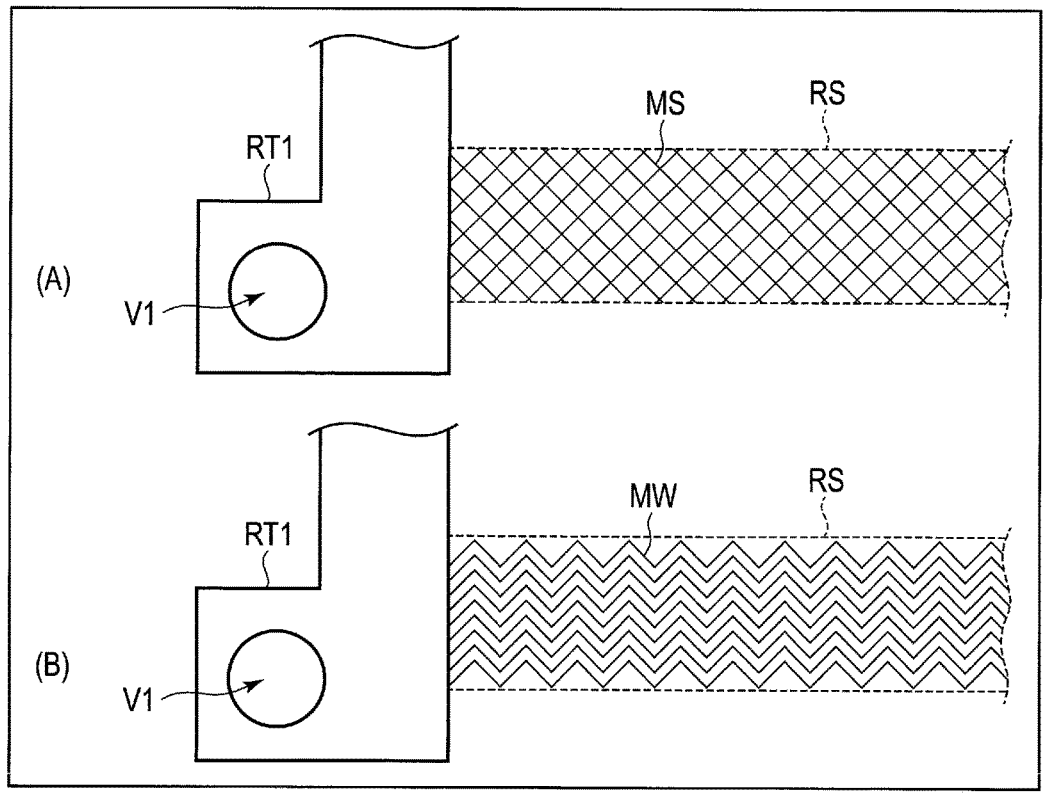
FIG. 5 is a diagram showing a configuration example of a detector of a detection electrode shown in FIG. 1.

The detector RS1 is located in the display area DA, and extends in the first direction X. In the detection electrode Rx1, the detector RS1 is mainly used for sensing. In the example illustrated, the detector RS1 is formed into a stripe shape, but more specifically, it is formed from an aggregate of fine metal thin wires as illustrated in FIG. 5. Further, one detection electrode Rx1 comprises two detectors RS, but may comprise three or more detectors RS, or may comprise only one detector RS.

The terminal RT1 is located on one end side of the non-display area NDA, along the first direction X, and is connected to the detectors RS. The connector CN1 is located on the other end side of the non-display area NDA along the first direction X and connects the plurality of detectors RS to each other. In FIG. 1, the one end side is on the left of the display area DA and the other end side is on the right thereof. A part of the terminal RT1 is formed in a position overlapping the sealant SE in planar view.

On the other hand, the first substrate SUB1 comprises a pad P1 and a wiring line W1, electrically connected to the wiring substrate SUB3. Let us assume in this embodiment that the pad P1 and the wiring line W1 are a first conducting layer L1 disposed on the second substrate SUB1. The pad P1 and the wiring line W1 are located in the one end side of the non-display area NDA and overlap the sealant SE in planar view. The pad P1 is formed in a position which overlaps the terminal RT1 in planar view. The wiring line W1 is connected to the pad P1, extending along the second direction Y, and is electrically connected to the detector RC of the IC chip I1 via the wiring substrate SUB3.

A contact hole V1 is formed in a position where the terminal RT1 and the pad P1 oppose each other. The contact hole V1 penetrates the second substrate SUB2 including the terminal RT1 and the sealant SE. Further, the contact hole V1 may penetrate the pad P1. As will be described later, a conductive connecting material C is formed in the contact hole V1. Thereby, the terminal RT1 and the pad P1 are electrically connected to each other. That is, the detection electrode Rx1 provided in the second substrate SUB2 is electrically connected to the detector RC via the wiring substrate SUB3 connected to the first substrate SUB1. The detector RC reads a sensor signal output from the detection electrode Rx to detect whether an object contacts or approaches, and the position coordinate of the object detected, etc.

In the example illustrated, the contact hole V1 is circular in planar view, but the shape thereof is not limited to that of the example illustrated, but may be some other shape such as elliptical.

In the example illustrated, the components of the odd-numbered detection electrodes Rx1, Rx3, . . . , namely, the terminals RT1, RT3, . . . , the pads P1, P3, . . . , the wiring lines W1, W3, . . . , and the contact holes V1, V3, . . . , are all located in the one end side of the non-display area NDA. On the other hand, the components of the even-numbered detection electrodes Rx2, Rx4, . . . , namely, the terminals RT2, RT4, . . . , the pads P2, P4, . . . , the wiring lines W2, W4, . . . , and the contact holes V2, V4, . . . , are all located in the other end side of the non-display area NDA. With such a layout, the width of one end side of the non-display area NDA and the width of the other end side can be equalized, thereby making it easier to reduce the width of the frame.

As illustrated, with the layout in which the pad P3 is closer to the wiring substrate SUB3 than the pad P1, the wiring line W1 detours around the inner side to the pad P3 (the side closer to the display area DA), and is located along and on the inner side of the wiring line W3 between the pad P3 and the wiring substrate SUB3. Similarly, the wiring line W2 detours around the inner side to the pad P4, and is located along and on the inner side of the wiring line W4 between the pad P4 and the wiring substrate SUB3.

FIG. 2 is a diagram showing a basic structure and an equivalent circuit of the display panel PNL shown in FIG. 1.

The display panel PNL comprises a plurality of pixels PX in the display area DA. Here, each pixel indicates a minimum unit individually controllable according to a pixel signal, and exists in the region containing a switching element provided at a position where a scanning line and a signal line cross each other, for example, which will be described later. The pixels PX are arranged in a matrix along the first direction X and the second direction Y. Further, the display panel PNL comprises a plurality of scanning lines G (G1 to Gn), a plurality of signal lines S (S1 to Sm), common electrodes CE, etc., in the display area DA. The scanning lines G each extend along the first direction X and are arranged along the second direction Y. The signal lines S each extend along the second direction Y and are arranged along the first direction X. The scanning lines G and the signal lines S are not necessarily formed to extend linearly, but may be partially bent. The common electrodes CE are each provided for a plurality of pixels PX. The scanning lines G, the signal lines S and the common electrodes CE are all drawn out to the non-display area NDA. In the non-display area NDA, the scanning lines G are connected to the scanning line drive circuit GD, the signal lines S are connected to the signal line drive circuit SD, and the common electrodes CE are connected to the common electrode drive circuit CD. The signal line drive circuit SD, the scanning line drive circuit GD and the common electrode drive circuit CD may be formed on the first substrate SUB1 or partially or entirely built in the IC chip I1 shown in FIG. 1.

Each pixel PX comprises a switching element PSW, a pixel electrode PE, a common electrode CE, a liquid crystal layer LC, etc. The switching element PSW is, for example, a thin film transistor (TFT) and is electrically connected to a respective scanning line G and a respective signal line S. More specifically, the switching element PSW comprises a gate electrode WG, a source electrode WS and a drain electrode WD. The gate electrode WG is electrically connected to the scanning line G. In the example illustrated, the electrode electrically connected to the signal line S is referred to as the source electrode WS, and the electrode electrically connected to the pixel electrode PE is referred to as the drain electrode WD.

The scanning line G is connected to the switching element PSW in each of those pixels PX which are arranged along the first direction X. The signal line S is connected to the switching element PSW in each of those pixels PX arranged along the second direction Y. Each of the pixel electrodes PE opposes the respective common electrode CE and drives the liquid crystal layer LC with an electric field produced between the pixel electrode PE and the common electrode CE. A storage capacitor CS is formed, for example, between the common electrode CE and the pixel electrode PE.

Figure 3:
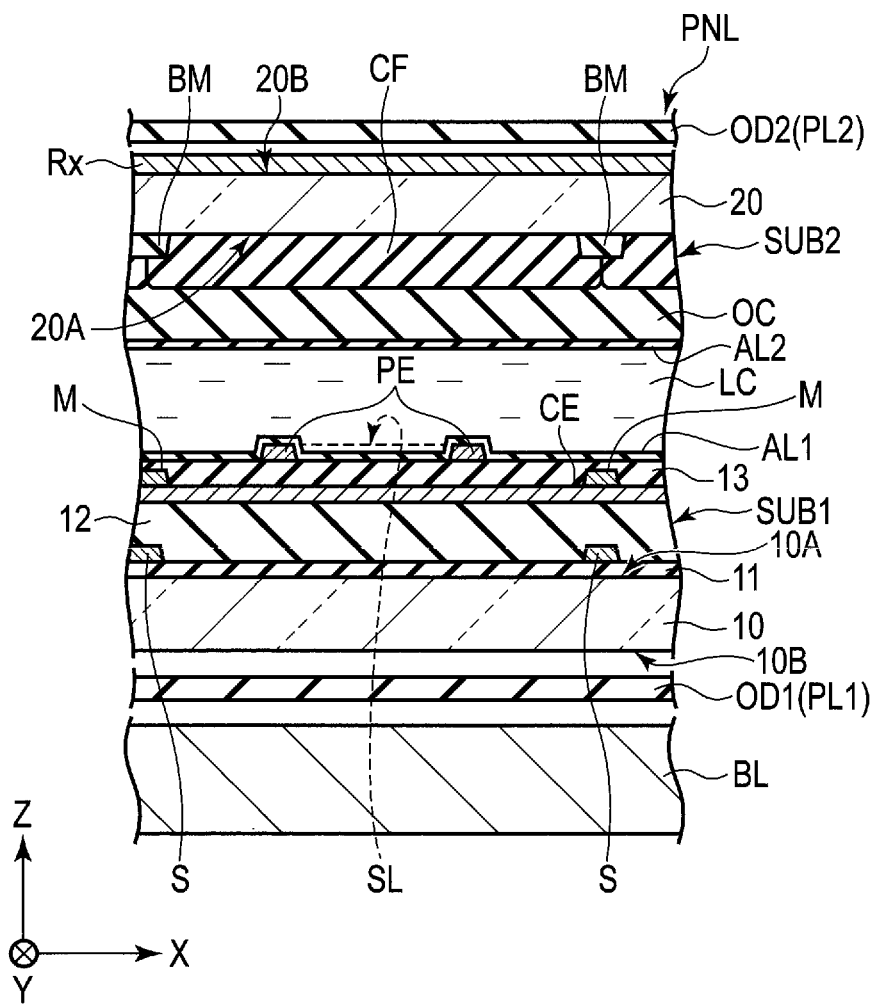
FIG. 3 is a cross-sectional view showing the structure of a part of the display panel shown in FIG. 1.

FIG. 3 is a cross section showing a part of structures of the display panel PNL shown in FIG. 1. Here, a cross section of the display device DSP cut along the first direction X is shown. The first substrate SUB1 and the second substrate SUB2 oppose the third direction Z.

In the following descriptions, the direction from the first substrate SUB1 towards the second substrate SUB2 is defined as above (or simply up), and the direction from the second substrate SUB2 towards the first substrate SUB1 is defined as below (or simply down). Viewing from the second substrate SUB2 towards the first substrate SUB1 is defined as planar view.

The display panel PNL illustrated here has a structure provided for the display mode which mainly uses a lateral electric field substantially parallel to a surface of the substrate. The display panel PNL may have a structure provided for display mode using a vertical electric field perpendicular to the surface of the substrate, or an electric field oblique to the surface, or a combination thereof. To the display mode using a lateral electric field, for example, such a structure is applicable, that both of the pixel electrode PE and the common electrode CE are provided one of the first substrate SUB1 and the second substrate SUB2. To the display mode using a vertical electric field or an oblique electric field, for example, such a structure is applicable, that one of the pixel electrode PE and the common electrode CE is provided on the first substrate SUB1, and the other one of the pixel electrode PE and the common electrode CE is provided on the second substrate SUB2. Note that the surface of the substrate here is that parallel to the X-Y plane.

The first substrate SUB1 comprises a first basement 10, signal lines S, a common electrode CE, metal layers M, a pixel electrode PE, a first insulating layer 11, a second insulating layer 12, a third insulating layer 13, a first alignment film AL1, etc. Note that the illustration of the switching element, scanning lines and various insulating layers interposed between these, etc., is omitted.

The first basement 10 comprises a surface 10A opposing the second substrate SUB2 and a surface 10B on an opposite side to the surface 10A. The first insulating layer 11 is located on the surface 10A of the first basement 10. The scanning lines and semiconductor layers of the switching element, which are not shown, are located between the first basement 10 and the first insulating layer 11. The signal lines S are located on the first insulating layer 11. The second insulating layer 12 is located on the signal lines S and the first insulating layer 11. The common electrode CE is located on the second insulating layer 12. The metal layers M are in contact with the common electrode CE at positions directly above the signal lines S, respectively. In the example illustrated, the metal layers M are located on the common electrode CE, but may be located between the common electrode CE and the second insulating layer 12. The third insulating layer 13 is located on the common electrode CE and the metal layers M. The pixel electrode PE is located on the third insulating layer 13. The pixel electrode PE opposes the common electrode CE via the third insulating layer 13. The pixel electrode PE comprises a slit SL in a position opposing the common electrode CE. The first alignment film AL1 covers the pixel electrode PE and the third insulating layer 13.

The structure of the first substrate SUB1 is not limited to the example illustrated, but the pixel electrode PE may be located between the second insulating layer 12 and the third insulating layer 13 and the common electrode CE may be located between the third insulating layer 13 and the first alignment film AL1. In such a case, the pixel electrode PE is formed into a plate shape without a slit, and the common electrode CE is formed to comprise a slit which opposes the pixel electrodes PE. Alternatively, both of the pixel electrode PE and the common electrode CE may be each formed into a comb teeth shape and arranged to engage with each other in gear.

The second substrate SUB2 comprises a second basement 20, light-shielding layers BM, color filters CF, an overcoat layer OC, a second alignment film AL2, etc.

The second basement 20 comprises a surface 20A opposing the first substrate SUB1 and a surface 20B on an opposite side to the surface 20A. The light-shielding layer BM and the color filter CF are located in the surface 20A of the second basement 20. The light-shielding layers BM partition the pixels from each other and are is located directly above the signal lines S, respectively. The color filters CF oppose the pixel electrodes PE and partially overlap the light-shielding layer BM. The color filter CF includes a red color filter, a green color filter, a blue color filter and the like. The overcoat layer OC covers the color filter CF. The second alignment film AL2 covers the overcoat layer OC.

The color filter CF may be disposed on the first substrate SUB1. The color filter CF may include color filters of four or more colors. On a pixel to display a white color, a white color filter or an uncolored resin material may be disposed or the overcoat layer OC may be disposed without disposing the color filter.

A detection electrode Rx is located on the surface 20B of the second basement 20. The detection electrodes Rx correspond to the second conducting layer L2, may be formed from a conductive layer containing a metal or a transparent conductive material such as ITO or IZO, or formed by depositing a transparent conductive layer on a conductive layer containing a metal, or formed of a conductive organic material or a dispersing element of a fine conductive material or the like.

A first optical element OD1 including a first polarizer PL1 is located between the first basement 10 and an illumination device BL. A second optical element OD2 including a second polarizer PL2 is located on the detection electrodes Rx. Each of the first optical element OD1 and the second optical element OD2 may include a retardation film as needed.

Each of the first basement 10 and the second basement 20 may be formed from, for example, no alkali glass, or a resin material. The scanning lines, the signal lines S and the metal layers M are each formed from a metal material such as molybdenum, tungsten, titanium or aluminum and may be formed in a single- or multi-layer structure. For example, the scanning lines are formed of a metal material containing molybdenum and tungsten, the signal lines S are formed of a metal material containing titanium and aluminum, and the metal layer M is formed of a metal material containing molybdenum and aluminum. The common electrode CE and the pixel electrodes PE are each formed of a transparent conductive material such as ITO or IZO. The first insulating layer 11 and the third insulating layer 13 are inorganic insulating layers while the second insulating layer 12 is an organic insulating layer.

Next, a configuration example of the sensor SS built in the display device DSP of this embodiment will be explained. The sensor SS explained below is, for example, a capacitive sensor of a mutual-capacitive type, which detects contact or approach of an object, based on the variation in electrostatic capacitance between a pair of electrodes opposing via a dielectric.

Figure 4:
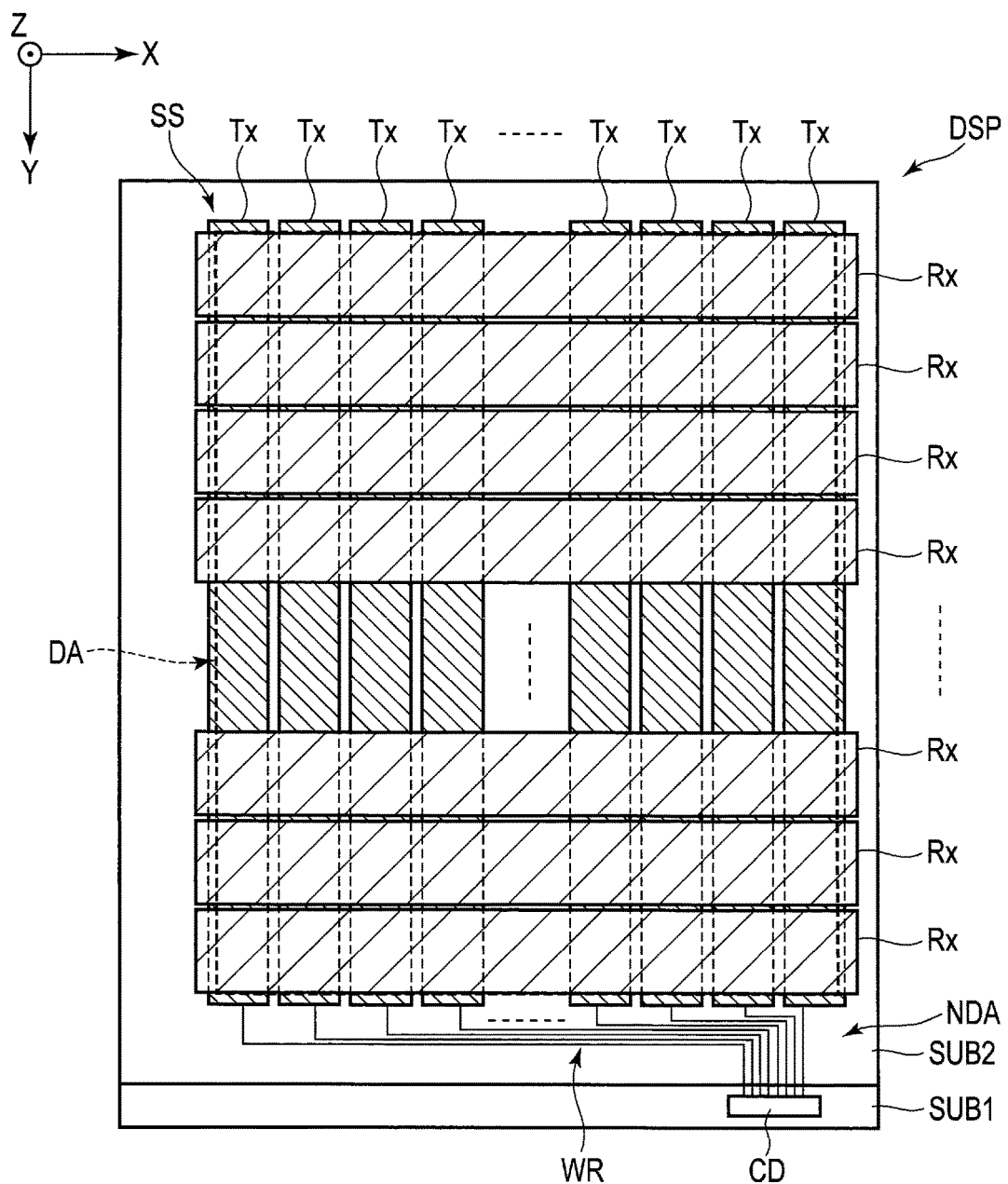
FIG. 4 is a plan view showing a configuration example of a sensor.

FIG. 4 is a plan view showing a configuration example of the sensor SS.

In the configuration example illustrated, the sensor SS comprises sensor drive electrodes Tx and detection electrodes Rx. In the example illustrated, the sensor drive electrodes Tx correspond to portions hatched by lines downwardly slanting to the right and are provided on the first substrate SUB1. The detection electrodes Rx correspond to portions hatched by lines upwardly slanting to the right and are provided on the second substrate SUB2. The drive electrodes Tx and the detection electrodes Rx cross each other in the X-Y plane. The detection electrodes Rx oppose the sensor drive electrodes Tx along the third direction Z.

The sensor drive electrodes Tx and the detection electrodes Rx are located in the display area DA and some of the electrodes extend out to the non-display area NDA. In the example illustrated, the drive electrodes Tx are each formed into a strip shape extending along the second direction Y and arranged along the first direction X to be spaced from each other. The detection electrodes Rx each extend along the first direction X and are arranged along the second direction Y to be spaced from each other. The detection electrodes Rx are connected to the pads provided on the first substrate SUB1 and electrically connected to the detection circuit RC via the wiring lines as explained with reference to FIG. 1. Each of the sensor drive electrodes Tx is electrically connected to the common electrode drive circuit CD via a wiring line WR. The number, size and shape of the sensor drive electrodes Tx and the detection electrodes Rx are not particularly limited but can be variously changed.

The sensor drive electrodes Tx each include the above-described common electrode CE, have a function of generating an electric field between itself and the respective pixel electrode PE and also a function of detecting the position of the object by generating the capacitance between itself and the respective detection electrode Rx.

The common electrode driving circuit CD supplies common drive signals to the drive electrodes Tx including the common electrode CE at the display driving time to display images on the display area DA. Further, the common electrode drive circuit CD supplies sensor drive signals to the sensor drive electrodes Tx at the sensing driving time to execute sensing. The detection electrodes Rx output sensor signals necessary for sensing (i.e., signals based on variation in inter-electrode capacitance between the sensor drive electrodes Tx and the detection electrodes Rx) in accordance with supply of the sensor drive signals to the sensor drive electrodes Tx. The detection signals output from the detection electrodes Rx are input to the detection circuit RC shown in FIG. 1.

The sensor SS in each of the above-explained configuration examples is not limited to the sensor of the mutual-capacitive type which detects the object based the variation in electrostatic capacitance between a pair of electrodes (in the above case, the electrostatic capacitance between the drive electrodes Tx and the detection electrodes Rx), but may be a self-capacitive type which detects an object based on the variation in electrostatic capacitance between the detection electrodes Rx.

In the example illustrated, the drive electrodes Tx each extend along the second direction Y and arranged along the first direction X with a gap between each adjacent pair, but the drive electrodes Tx each may extend along the first direction X and arranged along the second direction Y with a gap between each adjacent pair. In this case, the detection electrodes Rx each extend along the second direction Y and are arranged along the first direction X with a gap between each adjacent pair.

FIG. 5 is a diagram showing a configuration example of the detector RS in the detection electrode Rx1 shown in FIG. 1.

In the example shown in FIG. 5(A), the detector RS is formed of mesh-shaped metal wires MS. The metal wires MS are joined to the terminal RT1. In the example shown in FIG. 5(B), the detector RS is formed of wave-shaped metal wires MW. In the example illustrated, the metal wires MW are formed in a sawtooth shape but may be in some other shape such as a sine wave shape. The metal wires MW are joined to the terminal RT1.

The terminal RT1 is formed of, for example, the same material as that of the detector RS. A circular contact hole V1 is formed in the terminal RT1.

Figure 6:
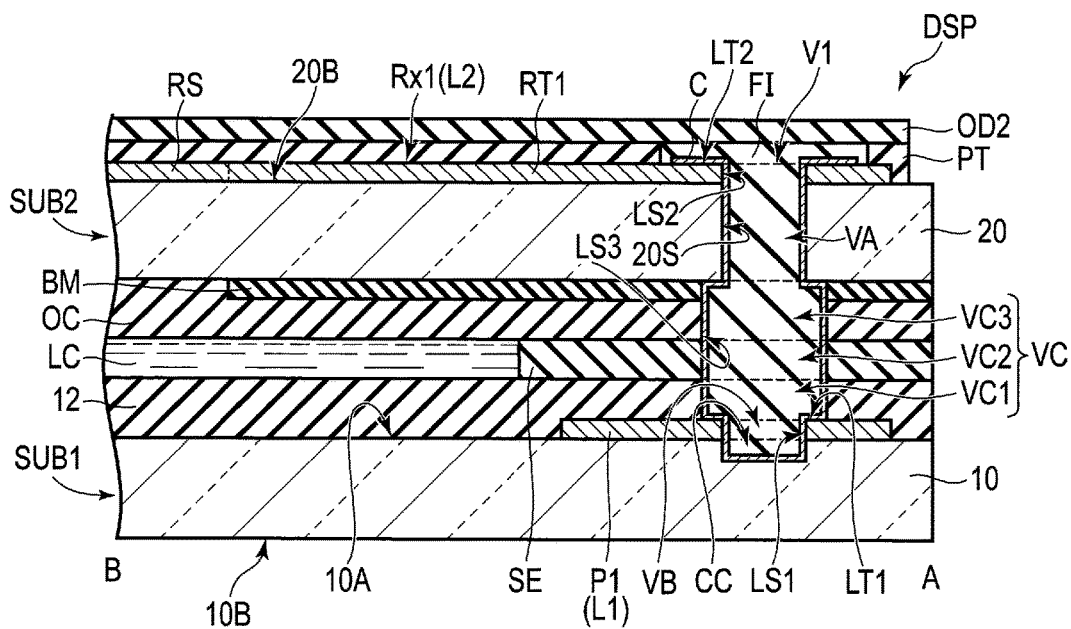
FIG. 6 is a cross section of the display panel taken along a line A-B shown in FIG. 1 including a contact hole.

FIG. 6 is a cross-sectional view showing the display panel PNL including the contact hole V1 shown in FIG. 1 as taken along in line A-B. Here, only main parts necessary for the explanation are shown.

In the example illustrated, the display device DSP comprises a first substrate SUB1, a second substrate SUB2, a sealant SE, a liquid crystal layer LC, a connecting material C, a filling material FI and a second optical element OD2.

The first substrate SUB1 includes a first basement 10, a pad P1 corresponding to the first conductive layer L1, a second insulating layer 12, etc. The following descriptions will be provided on the assumption that the pad P1 is the first conductive layer L1. In the example illustrated, the first conductive layer L1 is located on the surface 10A. The first conductive layer L1 is formed, for example, of the same material as that of the signal lines S shown in FIG. 3. In the example illustrated, the second insulating layer 12 is disposed on the basement 10 and the first conductive layer L1.

Note that the first insulating layer 11, and other insulating layers and conductive layers may be arranged between the first basement 10 and the pad P1, and between the first basement 10 and the second insulating layer 12.

The second substrate SUB2 comprises the second basement 20, the detection electrode Rx1 corresponding to the second conductive layer L2, a protection member PT, the light-shielding layer BM, the overcoat layer OC, etc. The following descriptions will be provided on the assumption that detection electrode Rx1 is the second conductive layer L2. The second conductive layer L2 is located in the surface 20B of the second basement 20. The protection member PT covers detection electrode Rx1. The protection member PT is in contact with the surface 20B of the second basement 20. The protection member PT is, for example, an organic insulating material such as acrylic resin. Although not illustrated, various insulating layers and conductive layers may be arranged between the second basement 20 and the second conductive layer L2.

The sealant SE is located between the second insulating layer 12 and the overcoat layer OC. The liquid crystal layer LC is located in a gap between the first substrate SUB1 and the second substrate SUB2.

Although not illustrated, between the second insulating layer 12 and the sealant SE, the metal layers M, the third insulating layer 13 and the first alignment film AL1 shown in FIG. 3 may be interposed. Further, between the overcoat layer OC and the sealant SE, the second alignment film AL2 shown in FIG. 3 may be interposed.

Here, the connecting structure between the first conductive layer L1 and the second conductive layer L2 in this embodiment will now be described in detail. In the second substrate SUB2, the second basement 20 comprises a hole (first hole) VA which penetrates between the surface 20A and the surface 20B. In the example illustrated, the hole VA also penetrates the second conductive layer L2.

On the other hand, in the first substrate SUB1, the first conductive layer L1 comprises a hole (second hole) VB opposing the hole VA along the third direction Z. Moreover, the various organic insulating layers of the second insulating layer 12, the sealant SE, the light-shielding layer BM, and the overcoat layer OC comprise a hole VC. More specifically, the hole VC includes a first part VC1 which penetrates the second insulating layer 12, a second part VC2 which penetrate the sealant SE, and a third part VC3 which penetrates the light-shielding layer BM and the overcoat layer OC.

The first basement 10 comprises a concavity CC opposing the hole VB along the third direction Z. The concavity CC, the hole VB, hole VC and hole VA are arranged in this order along the third direction Z. The concavity CC is formed from the surface 10A toward the surface 10B, but in the example illustrated, the concavity does not penetrate to the surface 10B. For example, the depth of the concavity CC along the third direction Z is about ⅓ to ½ of the thickness of the first basement 10 along the third direction Z. Note that the first basement 10 may comprise a hole which penetrates between the surface 10A and the surfaces 10B in place of the concavity CC. The holes VB and the concavity CC are each located directly under the hole VA. The holes VA, VB and VC and the concavity CC are located on the same straight line along the third direction Z, to form the contact hole V1.

The connecting material C is formed in the contact hole V1 to electrically connect the first conductive layer L1 and the second conductive layer L2 to each other. That is, the connecting material C is provided on the inner surface of each of the holes VA, VB and VC and the concavity CC. In the example illustrated, the connecting material C is in contact with each of an upper surface LT2 of the second conductive layer L2, an inner surface LS2 of the second conductive layer L2 in the hole VA, and an inner surface 20S of the second basement 20 in the hole VA, in the second substrate SUB2. The inner surfaces LS2 and 20S form the inner surface of the hole VA. Further, in the first substrate SUB1, the connecting material C is in contact also with each of the upper surface LT1 of the first conductive layer L1, an inner surface LS1 of the first conductive layer L1 in the hole VB and an inner surface LS3 of the various organic insulating layers in the hole VC and the concavity CC. The inner surface LS1 forms the inner surface of the hole VB, and the inner surface LS3 forms the inner surface of the hole VC.

In the example illustrated, the connecting material C is provided on the inner surface of each of the holes VA, VB and VC and the concavity CC, but it may be provided so as to fill the inside of each of the holes VA, VB, VC and the concavity CC. The connecting material C of such configuration is formed continuously between the first conductive layer L1 and the second conductive layer L2 without a break.

The first conductive layer L1 and the second conductive layer L2 are formed from, for example, a metal material such as molybdenum, tungsten, titanium, aluminum, silver, copper or chromium, or an alloy of any combination of these metal materials, or a transparent conductive material indium tin oxide (ITO) or indium zinc oxide (IZO), and may be of a single- or multi-layer structure. The connecting material C should preferably contain a metal material such as silver and fine particles having a diameter of the order of from several nanometers to tens of nanometers.

The hollow of the connecting material C is filled with a filling material FI. The filling material FI has, for example, conductivity and is prepared by hardening a paste containing conductive particles of silver or the like. With the conductive filling material FI, even if the connecting material C is broken off, the filling material FI can electrically connect the first conductive layer L1 and the second conductive layer L2 to each other, thereby making it possible to improve the reliability. Alternatively, the filling material FI may have, for example, insulating properties and be formed from an organic insulating material. With the filling material FI thus arranged, the difference in level along the third direction Z, resulting from the formation of the hollow in the connecting material C can be reduced. Further, the connecting material C can be protected.

According to the display device DSP comprising the sensor SS described above, the first conductive layer L1 (the detection electrodes Rx) provided in the second substrate SUB2 is connected to second conductive layer L2 (the pad P1) provided in the first substrate SUB1 by the connecting material C provided in the contact hole V. Therefore, it is no longer necessary to mount a wiring board on the second substrate SUB2 in order to connect the first conductive layer L1 and the detection circuit RC to each other. That is, the wiring substrate SUB3 mounted on the first substrate SUB1 forms a transmission line for transmitting signals necessary to display images on the display panel PNL, and also a transmission line for transmitting signals between the detection electrodes Rx and the detector RC. Therefore, as compared to the configuration example which requires individual wiring boards in addition to the wiring substrate SUB3, the number of wiring boards can be decreased, and therefore the production cost can be reduced. Moreover, the space for connecting the wiring boards to the second substrate SUB2 is not necessary, and therefore the non-display area of the display panel PNL, especially the width of the side edge in which the wiring substrate SUB3 is mounted can be decreased. Thus, the width of the frame can be reduced and the cost can be reduced.

Next, an example of the method of manufacturing the display device DSP described above will be explained with reference to FIGS. 7 to 15.

FIG. 7 is a cross section for illustrating a step of preparing the display panel PNL.

First, as shown in FIG. 7, a display panel PNL is prepared. The display panel PNL illustrated comprises a first substrate SUB1 comprising at least the first basement 10 and the first conductive layer L1, and the second substrate SUB2 comprising at least the second basement 20 and the second conductive layer L2. In the display panel PNL, the first substrate SUB1 and the second substrate SUB2 are attached together by the sealant SE while the second substrate SUB2 opposes the first conductive layer L1 and the second substrate SUB2 is spaced from the first conductive layer L1. As described above, the first conductive layer L1 here corresponds to the pad P1 or the like shown, for example, in FIG. 6, and the second conductive layer L2 corresponds to the detection electrode Rx1 shown, for example, in FIG. 6.

An example of the method of manufacturing such a display panel PNL will be described. That is, a first substrate SUB1 is prepared, in which a first conductive layer L1, a second insulating layer 12 and the like are formed on a surface 10A of a first basement 10. On the other hand, a second substrate SUB2 is prepared, in which a light-shielding layer BM, an overcoat layer OC and the like are formed on a surface 20A of a second basement 20. At this point, the second conductive layer is not formed on the surface 20B of second substrate SUB2. On one of the first substrate SUB1 and the second substrate SUB2, the sealant SE is formed along edge sides of the respective substrate, and a liquid crystal material is dropped on a region surrounded by the sealant SE. After that, the first substrate SUB1 and the second substrate SUB2 are attached together, and the sealant SE is hardened, to adhere the first substrate SUB1 and the second substrate SUB2 together. Then, the first basement 10 and the second basement 20 are each etched with an etching solution such as of hydrofluoric acid (HF), so as to thin the first basement 10 and the second basement 20. Then, the second conductive layer L2 is formed in the surface 20B of the second basement 20, and a protection material PT is formed on the second substrate SUB2 so as to cover the second conductive layer L2. Thus, the display panel PNL shown in FIG. 7 is manufactured.

Another example of the manufacture method for the display panel PNL will be described. That is, as in the above-described example, a first substrate SUB1 is prepared. Meanwhile, a second substrate SUB2 is prepared, in which a light-shielding layer BM, an overcoat layer OC, etc. are formed on a surface 20A of a second basement 20, a second conductive layer L2 is formed on the surface 20B of the second basement 20, and a protection material PT is formed on the second substrate SUB2 so as to cover the second conductive layer L2. After that, a sealant SE is provided and a liquid crystal material is dropped, and the first substrate SUB1 and the second substrate SUB2 are adhered to each other. Thus, the display panel PNL shown in FIG. 7 is manufactured.

FIG. 8 is a cross section for illustrating a processing step of providing a protection layer PF and irradiating a laser beam L.

Subsequently, as shown in FIG. 8, the protection layer PF is provided on the second substrate SUB2.

Here, the protection layer PF is, for example, a film. The processing step of providing the protection layer PF on the second substrate SUB2 corresponds to the step of attaching the film on the second substrate SUB2. The protection layer PF contains, for example, polyethylene terephthalate.

The protection layer PF may be formed from an organic insulating material. In this case, the processing step of providing the protection layer PF on the second substrate SUB2 corresponds to that of applying an organic insulating material on the second substrate SUB2. The protection layer PF contains, for example, acrylic resin.

Next, the second substrate SUB2 is irradiated with the laser beam L in a position overlapping the protection layer PF. In the example illustrated, the laser beam L is irradiated from above the second conductive layer L2. As the laser light source, for example, a carbon dioxide gas laser device is applicable, but as long as it can drill a hole in a glass or organic material, any type will do, and for, for example, an excimer laser device is applicable as well.

In the example shown in FIGS. 7 and 8, the protection material PT is formed before providing the protection layer PF, but the process is not limited to this example. For example, the protection layer PF may be provided on the second conductive layer L2 without forming the protection material PT in the processing step shown in FIGS. 7 and 8. A detailed explanation on the processing step will be provided later.

FIG. 9A is a cross section showing the display panel PNL after irradiating the laser beam L thereto.

With the irradiation of the laser beam L, a hole VA is formed to penetrate the second basement 20 and the second conductive layer L2 as shown in FIG. 9A. Further, in the example illustrated, when the laser beam L is irradiated, formed are a third part VC3 of the hole penetrating the light-shielding layer BM and the overcoat layer OC, located directly under the hole VA, a second part VC2 of the hole penetrating the sealant SE located directly under the third part VC3, a first part VC1 penetrating the second insulating layer 12 located directly under the second part VC2, a hole VB penetrating the first conductive layer L1 located directly under the first part VC1, and a concavity CC of the first basement 10 located directly under the hole VB all at the same time. Thus, the contact hole V1 is formed to connect the first conductive layer L1 and the second conductive layer L2 to each other.

Further, with the irradiation of the laser beam L, an inner surface PFS1 of the protection material PT and an inner surface PFS2 of the protection layer PF are set back with respect to an inner surface LS2 of the second conductive layer L2 and an inner surface 20S of the second basement 20.

After the irradiation of the laser beam L, a residual RE containing glass pieces, conductive materials, etc., attach onto the protection layer PF. The residual RE adheres around the hole penetrating the protection layer PF, and hardly adheres to the upper surface LT2 of the second conductive layer L2 or the surface 20B of or the second basement 20.

FIG. 9B is a plan view showing the holes VA and VD in the positions with relative to each other shown in FIG. 9A.

To form the hole VA, the second substrate is irradiated with the laser beam, and thus the hole VD (third hole) which penetrates the protection layer PF is formed. The hole VA and hole VD are circular in planar view. The centers of the holes VA and VD are located at a point O. That is, the hole VA is concentric with the hole VD. Further, the hole VA has a diameter W21 and the hole VD has a diameter W22. The diameter W22 is greater than the diameter W21. Therefore, the upper surface LT2 of the second conductive layer L2 is exposed from the hole VD. FIG. 10 is a cross section for illustrating a processing step of removing the protection layer PF.

Next, the protection layer PF to which the residual RE adhered is removed from the second substrate SUB2. Here, the adhesion between the protection material PT and the protection layer PF should preferably weaker than the adhesion between the protection material PT and the second conductive layer L2. Therefore, the peeling off of the protection material PT, which may occur while removing the protection layer PF therewith, can be inhibited.

FIG. 11 is a cross section for illustrating the processing step of injecting the connecting material C into the hole VA.

After removing the protection layer PF, as shown in FIG. 11, the connecting material C is formed to electrically connect the first conductive layer L1 and the second conductive layer L2 via the hole VA. More specifically, as shown in FIG. 11, after installing the display panel PNL in a chamber CB, the air in the chamber CB is discharged and the connecting material C is injecting to the hole VA in a vacuum (under the environment of a pressure lower than atmospheric pressure). Here, in some cases, the connecting material C may not flow into the first conductive layer L1, and a space SP may be formed between the connecting material C and the first conductive layer L1. Note here that the space SP is a vacuum.

FIG. 12 is a cross section for illustrating a processing step for filling the connecting material C from the hole VA to the holes VC and VB and the concavity CC.

As shown in FIG. 12, a gas such as air or inert gas is introduced into the chamber CB, thereby reducing the degree of vacuum. Therefore, a difference in atmospheric pressure is created between the space SP and the surrounding of the display panel PNL, and thus the connecting material C flows from the hole VA into the holes VC and VB and the concavity CC, to be brought into contact with the first conductive layer L1.

FIG. 13 is a cross section for illustrating a processing step of evaporating the solvent contained in the connecting material C.

As shown in FIG. 13, the solvent contained in the connecting material C is removed, and thus the volume of the connecting material C decreases and the hollow HL is formed. The connecting material C thus formed is brought into contact with each of the second conductive layer L2 and the second basement 20 in the hole VA, with each of the light-shielding layer BM, the overcoat layer OC, the sealant SE and the second insulating layer 12 in the hole VC, with the first conductive layer L1 in the hole VB, and with the first basement 10 in the concavity CC.

Note that the method of formation of the connecting material C illustrated with reference to FIG. 13 is merely an example, and is not limited to this. For example, the connecting material C similar to the above can be formed with such a technique of removing the solvent contained in the connecting material C after injecting the connecting material C into the hole VA under atmospheric pressure.

FIG. 14 is a cross section for illustrating a processing step of forming a filling material FI.

Subsequently, as shown in FIG. 14, the filling material FI is formed. In the example illustrated, the hollow HL of the connecting material C is filled with the filling material FI. Further, the filling material FI covers the connecting material C so as to be in contact with the second conductive layer L2 as well. Thereby, a surface SUB2A of the second substrate SUB2 is substantially planarized to reduce the difference in level between the contact hole V1 and the overlapping portion.

FIG. 15 is a cross section for illustrating a processing step of adhering a second optical element OD2.

Next, as shown in FIG. 15, the second optical element OD2 is adhered to the protection material PT. In the example illustrated, the second optical element OD2 extends also to a portion overlapping the contact hole V1 to be in contact with the filling material FI as well. Since the difference in level resulting from the contact hole V1 is reduced by the filling material FI, the peeling of the second optical element OD2 can be inhibited, which may occur due to the difference in level in the underlayer of the second optical element OD2 after adhering the second optical element OD2.

According to this embodiment, before the step of processing step of forming the hole VA by irradiation of the laser beam L, the protection layer PF is provided on the second substrate SUB2. Thus, after the irradiation of the laser beam L, even if the residual RE containing glass pieces and the like adheres on the protection layer PF, the residual RE does not remain in the display panel PNL when the protection layer PF is removed. Therefore, a malfunction of the display device, which may be caused by the remaining residual RE, for example, connection error between the second conductive layer L2 and the connecting material C, caused by the difference in level around the hole VA can be inhibited.

According to this embodiment, the first conductive layer L1 and the second conductive layer L2 are electrically connected to each other via the connecting material C. Thus, control circuits for writing signals to the second conductive layer L2, or reading signals output from the second conductive layer L2 are connectable with the second conductive layer L2 via the wiring board SUB3. That is, in order to connect the second conductive layer L2 and the control circuits to each other, it is not necessary to provide another wiring board in the second substrate SUB2. Therefore, in this embodiment, terminals for mounting another wiring board, or routing wiring line for connecting the second conductive layer L2 to another wiring board are no longer necessary. Therefore, the size of the second substrate SUB2 can be reduced, and also the frame width of the peripheral part of the display device DSP can be reduced. Further, the cost can be reduced because the wiring board which is no longer necessary. Thus, the width of the frame can be reduced, and a lower cost can be achieved.

Next, another example of the method of manufacturing the display device DSP described above will be explained with reference to FIGS. 16 to 20. In the manufacturing method shown in FIGS. 7 to 15, the protection material PT is formed before providing the protection layer PF, whereas in the method shown in FIGS. 16 to 20 is different in that the protection layer PF is provided before forming the protection material PT and thereafter the protection layer PF is removed. Of the method shown in FIGS. 16 to 20, the parts overlapping the manufacture method shown in FIGS. 7 to 15 will be omitted.

FIG. 16 is a cross section for illustrating a processing step of providing the protection layer PF and irradiating the laser beam L thereonto. The structure shown in FIG. 16 is different from that shown in FIG. 8 in that the protection layer PF is directly provided on the second conductive layer L2.

Here, the protection layer PF is, for example, an organic insulating material. Here, the processing step of providing the protection layer PF on the second substrate SUB2 corresponds to that of applying an organic insulating material on the second substrate SUB2, and therefore the protection layer PF is in contact with the surface 20B of the second basement 20. The protection layer PF may be, for example, a film and the film may be adhered on the second substrate SUB2.

Next, the second substrate SUB2 is irradiated with the laser beam L in the position where the first conductive layer L1 and the second conductive layer L2 overlap.

FIG. 17 is a cross section showing the display panel PNL after irradiated with the laser beam L.

With the irradiation of the laser beam L, as shown in FIG. 17, the contact hole V1 is formed to connect the first conductive layer L1 and the second conductive layer L2. After the irradiation of the laser beam L, a residual RE containing glass pieces, a conductive material, etc. adheres on the protection layer PF. The residual RE adheres around the hole which penetrates the protection layer PF, and hardly adheres onto the upper surface LT2 of the second conductive layer L2 or the surface 20B of the second basement 20.

FIG. 18 is a cross section for illustrating a processing step of removing the protection layer PF.

Next, the protection layer PF to which the residual RE adhered is removed from the second substrate SUB2. Subsequently, the processing step of forming the connecting material C is already described with reference to FIGS. 11 to 13, the explanation thereof is omitted here. The connecting material C is in contact with each of the second conductive layer L2, the second basement 20, the light-shielding layer BM, the overcoat layer OC, the sealant SE, the second insulating layer 12, the first conductive layer L1 and the first basement 10.

FIG. 19 is a cross section for illustrating a processing step of forming the filling material FI and the protection material PT.

Subsequently, as shown in FIG. 19, the filling material FI is formed. In the example illustrated, the hollow HL of the connecting material C is filled with the filling material FI. Next, the protection material PT is formed on the second substrate SUB2 so as to cover the second conductive layer L2. The protection material PT covers the filling material FI as well.

FIG. 20 is a cross section for illustrating a processing step of adhering the second optical element OD2.

Subsequently, as shown in FIG. 20, the second optical element OD2 is adhered to the protection material PT. In the example shown in FIG. 15, the second optical element OD2 is in contact with the filling material FI, whereas in the example shown in FIG. 20, the second optical element OD2 is not in contact with the protection material PT. Further, in the example shown in FIG. 15, the protection material PT comprises a hole, whereas in the example shown in FIG. 20, the protection material PT does not comprise a hole.

As described above, according to this embodiment, a method of manufacturing a display device whose width of the frame can be reduced, and which can lower the cost can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

An example of the display device obtained from the structure disclosed in this specification will be appended.

(1) A method of manufacturing an electronic device, comprising:

preparing a first substrate comprising a first basement and a first conductive layer, and a second substrate comprising a second basement and a second conductive layer, opposing the first conductive layer and spaced from the first conductive layer;

providing a protection layer on the second substrate;

forming a first hole penetrating the second substrate by irradiating the second substrate with a laser beam in a position overlapping the protection layer;

removing the protection layer; and forming a connecting material electrically connecting the first conductive layer and the second conductive layer to each other via the first hole after removing the protection layer.

(2) The method according to (1), wherein
the protection layer is a film.

(3) The method according to (2), wherein
the providing of the protection layer comprises adhering the film on the second substrate.

(4) The method according to (2), wherein
the film contains polyethylene terephthalate.

(5) The method according to (2), further comprising:
forming a protection member which covers the second conductive layer before the providing the protection layer, and forming the protection layer on the protection member.

(6) The method according to (5), wherein
an adhesion between the protection layer and the protection member is weaker than an adhesion between the protection member and the second conductive layer.

(7) The method according to (1), wherein
the protection layer contains an organic insulating material.

(8) The method according to (7), wherein
the providing the protection layer comprises applying the organic insulating material on the second substrate.

(9) The method according to (7), wherein
the organic insulating material contains an acrylic resin.

(10) The method according to (1), further comprising:
forming a second hole which penetrates the first conductive layer in a position opposing the first hole by irradiating the laser beam thereto.

(11) The method according to (10), further comprising:
forming a concavity in the first basement in a position opposing the second hole by irradiating the laser beam thereto.

(12) The method according to (1), wherein
the connecting material contains metal fine particles having a diameter of the order of from several nanometers to tens of nanometers.

(13) The method according to (1), wherein
the laser beam is a carbon dioxide gas laser beam.

(14) The method according to (1), further comprising:
forming a third hole which penetrates the protection layer by irradiating the laser beam on the second basement when forming the first hole.

(15) The method according to (14), wherein
the first hole and the third hole are circular in planer view and the first hole is circular concentric with the third hole.

(16) The method according to (15), wherein
a diameter of the third hole is greater than that of the first hole.

(17) The method according to (16), wherein
an upper surface of the second conductive layer is exposed from the third hole.

(18) The method according to (1), further comprising:
forming a protection member which covers the second conductive layer after the removing the protection layer.

What is claimed is:

1. A method of manufacturing an electronic device, comprising:
preparing a first substrate comprising a first basement and a first conductive layer, and a second substrate comprising a second basement and a second conductive layer, opposing the first conductive layer and spaced from the first conductive layer;
providing a protection layer on the second substrate;
forming a first hole penetrating the second substrate by irradiating the second substrate with a laser beam in a position overlapping the protection layer;
removing the protection layer;
forming a connecting material electrically connecting the first conductive layer and the second conductive layer to each other via the first hole after removing the protection layer, and
forming a protection member which covers the second conductive layer before the providing the protection layer, and forming the protection layer on the protection member, wherein
the protection layer is a film.

2. The method according to claim 1, wherein
the providing of the protection layer comprises adhering the film on the second substrate.

3. The method according to claim 1, wherein
the film contains polyethylene terephthalate.

4. The method according to claim 1, wherein
an adhesion between the protection layer and the protection member is weaker than an adhesion between the protection member and the second conductive layer.

5. The method according to claim 1, wherein
the protection layer contains an organic insulating material.

6. The method according to claim 5, wherein
the providing the protection layer comprises applying the organic insulating material on the second substrate.

7. The method according to claim 5, wherein
the organic insulating material contains an acrylic resin.

8. The method according to claim 1, further comprising:
forming a second hole which penetrates the first conductive layer in a position opposing the first hole by irradiating the laser beam thereto.

9. The method according to claim 8, further comprising:
forming a concavity in the first basement in a position opposing the second hole by irradiating the laser beam thereto.

10. The method according to claim 1, wherein
the connecting material contains metal fine particles having a diameter of the order of from several nanometers to tens of nanometers.

11. The method according to claim 1, wherein
the laser beam is a carbon dioxide gas laser beam.

12. The method according to claim 1, further comprising:
forming a third hole which penetrates the protection layer by irradiating the laser beam on the second basement when forming the first hole.

13. The method according to claim 12, wherein
the first hole and the third hole are circular in planer view and the first hole is circular concentric with the third hole.

14. The method according to claim 13, wherein
a diameter of the third hole is greater than that of the first hole.

15. The method according to claim 14, wherein
an upper surface of the second conductive layer is exposed from the third hole.

* * * * *